United States Patent [19]

Pawlikowski

[11] Patent Number: 5,357,074
[45] Date of Patent: Oct. 18, 1994

[54] ELECTRICAL INTERCONNECTION DEVICE

[75] Inventor: Joseph M. Pawlikowski, Lancaster, Pa.

[73] Assignee: The Whitaker Corporation, Wilmington, Del.

[21] Appl. No.: 108,158

[22] Filed: Aug. 17, 1993

[51] Int. Cl.⁵ .............................................. B23K 1/00
[52] U.S. Cl. ............................ 219/85.18; 219/85.16; 219/553; 439/580
[58] Field of Search ............... 219/85.22, 85.18, 85.16, 219/85.11, 553; 439/580

[56] References Cited

U.S. PATENT DOCUMENTS

| 4,852,252 | 8/1989 | Ayer | 29/860 |
| 4,990,736 | 2/1991 | Henschen et al. | 219/10.75 |
| 4,995,838 | 2/1991 | Ayer et al. | 439/874 |
| 5,032,703 | 7/1991 | Henschen et al. | 219/85.22 |
| 5,059,756 | 10/1991 | Henschenp et al. | 218/85.22 |
| 5,065,501 | 11/1991 | Henschen et al. | 29/611 |
| 5,090,116 | 2/1992 | Henschen et al. | 29/827 |
| 5,190,473 | 3/1993 | Mroczkowski et al. | 439/580 |

FOREIGN PATENT DOCUMENTS 0241597  10/1987  European Pat. Off. .

Primary Examiner—Clifford C. Shaw
Attorney, Agent, or Firm—Katherine A. Nelson

[57] ABSTRACT

A device 10 usable in conjunction with a source of constant amplitude high frequency alternating current of known frequency for providing sufficient thermal energy to melt a fusible electrically conductive material 32 includes an integral member formed from strip 12 of a first metal having a carrier strip section 14 and a plurality of fingers 20 initially integrally coextending therefrom. The carrier strip section 14 further has a thin magnetic layer 18 thereon, transforming the carrier strip into a Curie point heater. The fingers 20 including end portions 22 having layers of solder affixed to opposite sides thereof are adapted to receive bare end portions of conductors 36 inserted into slots 28 thereof. The device 10 and the conductors 36 disposed therein are placed on the board 50 with the respective conductors 36 opposed from respective contact pads 52 and separated by the finger end portions 22. Upon subjecting the heater body 14 to the constant current of known frequency, the heater body 14 generates and transfers sufficient thermal energy to the finger end portions 22 to melt the fusible material 32 disposed therealong thereby electrically and mechanically interconnecting the array of conductors to the contact pads 52. The heater body 14 is then detached from the fingers 20 thereby electrically isolating the interconnections.

7 Claims, 3 Drawing Sheets

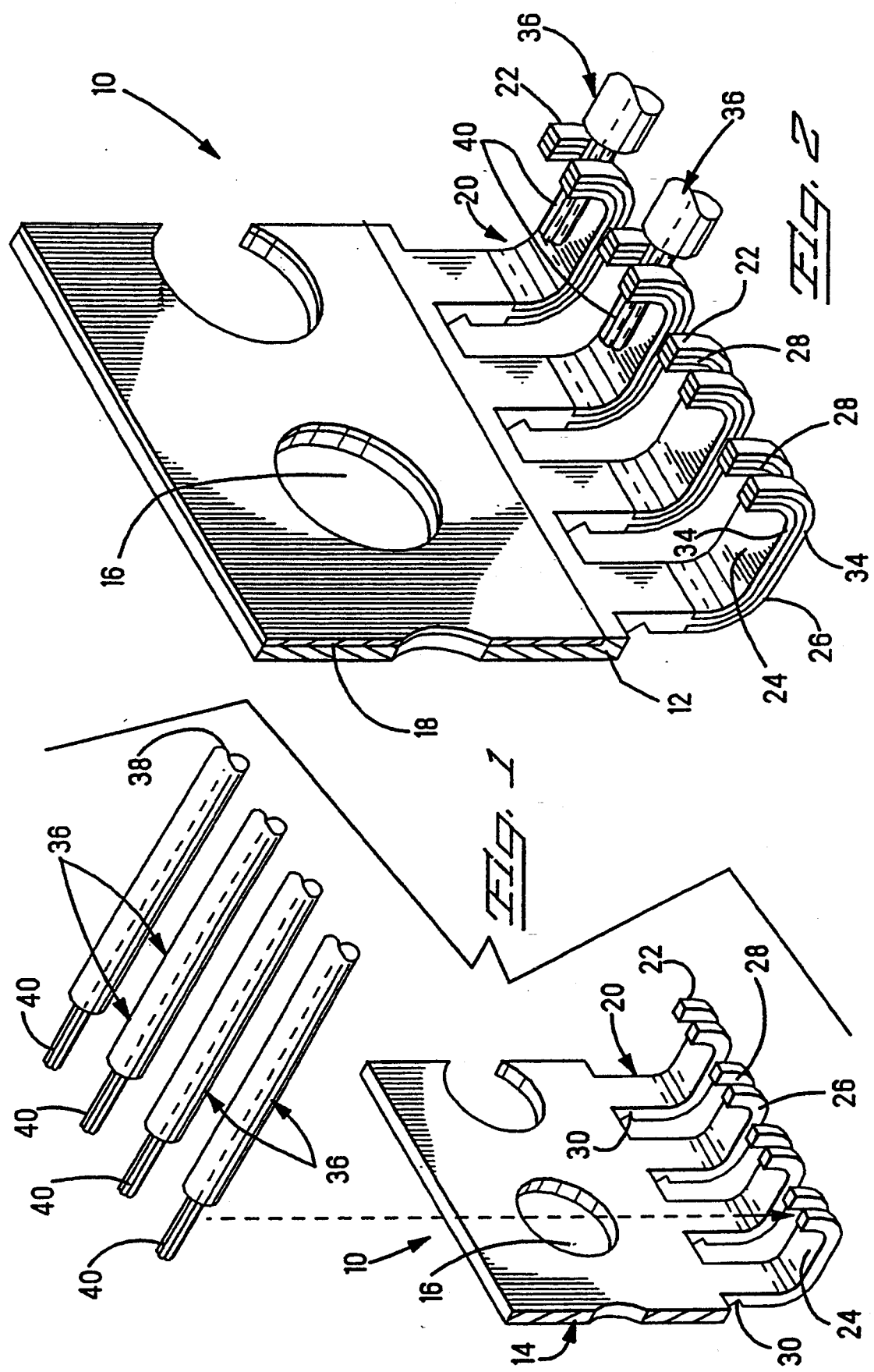

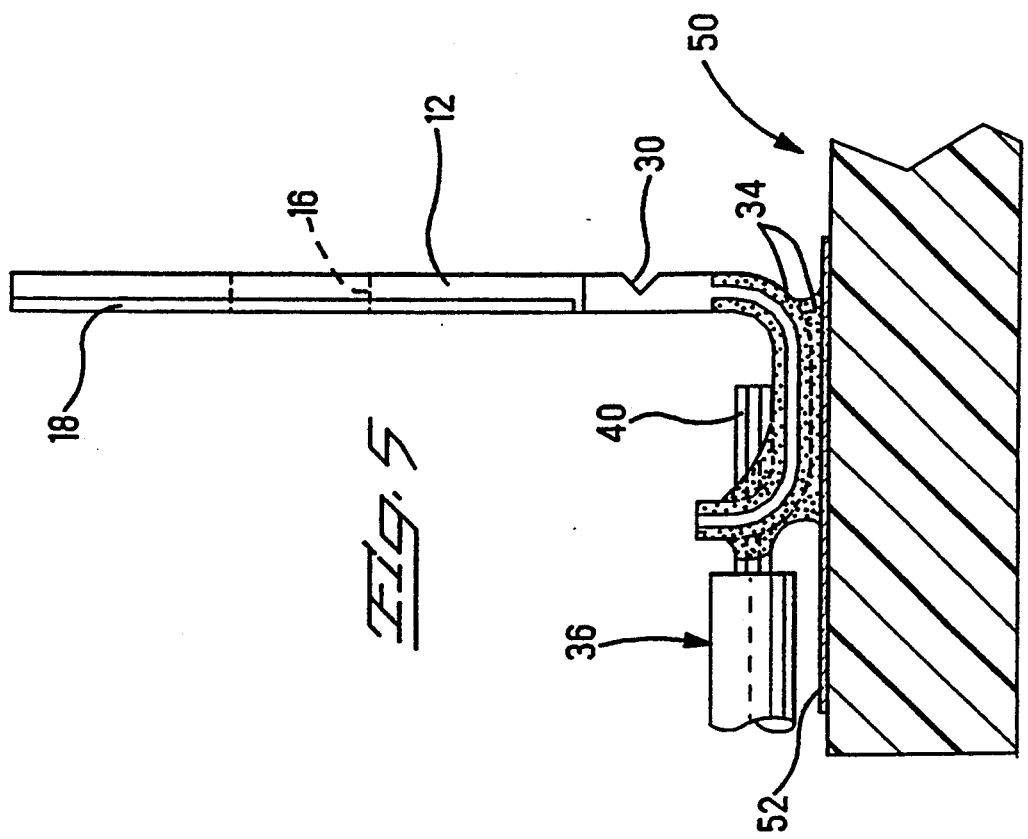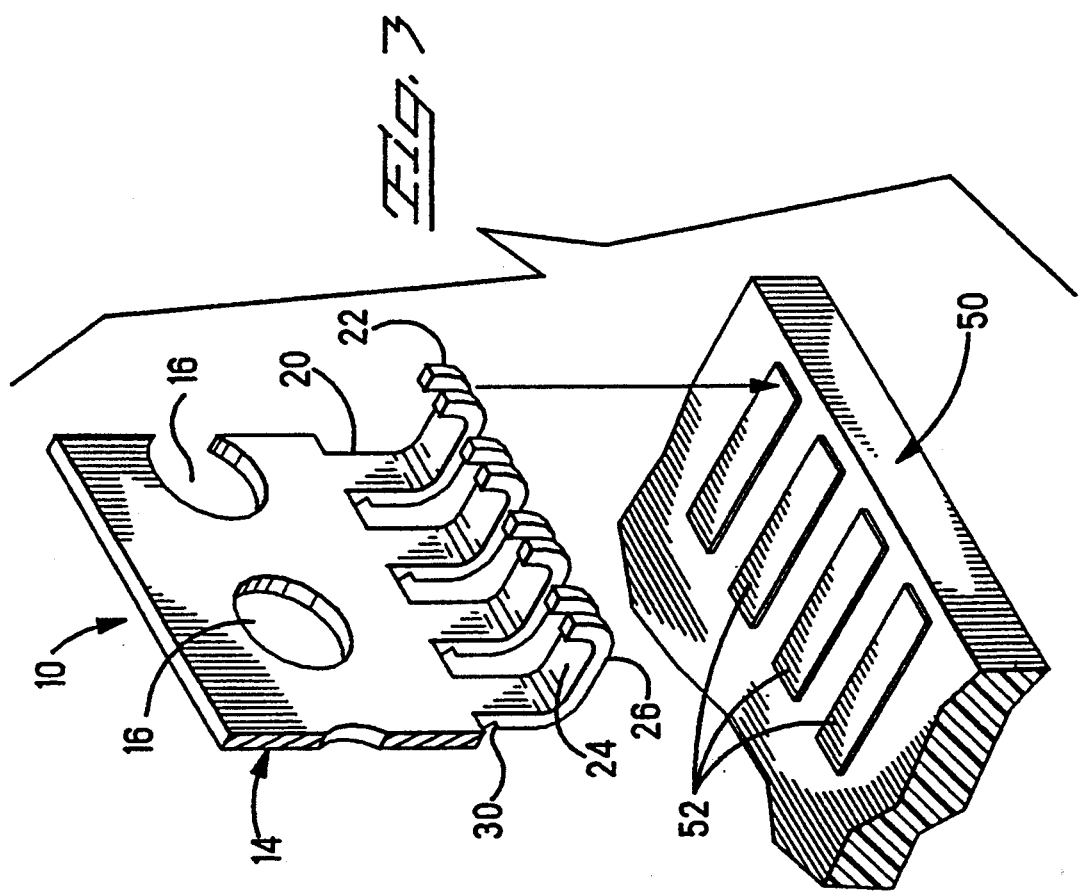

ELECTRICAL INTERCONNECTION DEVICE

FIELD OF THE INVENTION

The present invention relates toga device for soldering a plurality of conductors to a plurality of contact elements, and more particularly to a device for soldering an opposed array of cable conductors to contact elements on an electrical article.

BACKGROUND OF THE INVENTION

U.S. Pat. No. 4,852,252 discloses providing each of the terminals of a connector with a thin layer of magnetic material along the surface of the nonmagnetic low resistance solder tail of the terminal facing away from the surface to which a wire end will be soldered; in U.S. Pat. No. 4,995,838 a preform of foil having a magnetic layer is disclosed to be soldered to the terminal solder tail's wire-remote surface. The bimetallic structure uses the Curie temperature of the magnetic material to define an article which will generate thermal energy when subjected to radio frequency current of certain frequency for sufficient short length of time until a certain known temperature is achieved, above which the structure is inherently incapable of rising; by selecting the magnetic material and sufficient thickness thereof and selecting an appropriate solder, the temperature achieved can be selected to be higher than the reflow temperature of the solder preform; when the terminal is subjected through induction to RF current of the appropriate frequency, the solder tail will generate heat which will radiate to the solder preform, reflow the solder, and be conducted along the wire and the terminal and radiate further to shrink the tubing and melt the sealant material. The terminal thus includes an integral mechanism for enabling simultaneous soldering and sea,ling without other application of heat; excess heat is avoided as is the potential of heat damage to remaining portions of the connector or tubing.

Another U.S. Pat. No. 4, 789, 767 discloses a multi-pin connector whose contacts have magnetic material layers on portions thereof spaced from the contact sections to be surface mounted to respective traces on the surface of a printed circuit board. An apparatus is disclosed having a coil wound magnetic core having multiple shaped pole pieces in spaced pairs with an air gap therebetween within which the connector is placed during soldering. The pole pieces concentrate flux in the magnetic contact coating upon being placed beside the contact sections to be soldered, to transmit RF current to each of the contacts, generating thermal energy to a known maximum temperature to reflow the solder and join the contact sections to the conductive traces of the printed circuit element.

U.S. Pat. No. 5,059,756 discloses a self-regulating temperature heater with thermally conductive extensions that is used to solder a plurality of spaced contacts on one member with a corresponding plurality of contacts on a second member. The contacts on at least one of the members is either at an edge of member such as a circuit board or is along an outer edge of a connector such as surface mount contacts or exposed wires at the edge of a cable or the like. The heater uses a bimetallic structure similar to, the ones disclosed in the previously discussed patents.

Such Curie point heating is disclosed in U.S. Pat. Nos. 4,256,945; 4,623,401; 4,659,912; 4,695,713; 4,701,587; 4,717,814; 4,745,264 and European Patent Publication No. 0241,597. When a radio frequency current for example is passed through Such a bipartite structure, the current initially is concentrated in the thin high resistance magnetic material layer which causes heating; when the temperature in the magnetic material layer reaches its Curie temperature, it is known that the magnetic permeability of the layer decreases dramatically; the current density profile then expands into the non-magnetic substrate of low resistivity. The thermal energy is then transmitted by conduction to adjacent structure such as wires and solder which act as thermal sinks; since the temperature at thermal sink locations does not rise to the magnetic material's Curie temperature as quickly as at non-sink locations, the current remains concentrated in those portions of the magnetic material layer adjacent the thermal sink locations and is distributed in the low resistance substrate at non-sink locations. It is known that for a given frequency the self-regulating temperature source thus defined achieves and maintains a certain maximum temperature dependent on the particular magnetic material. One source for regenerating radio frequency current such as of 13.56 mHz is disclosed in U.S. Pat. No. 4,626,767.

The conductive substrate can be copper having a magnetic permeability of about one and a resistivity of about 1.72 micro-ohm-centimeters. The magnetic material may be for example a clad coating of nickel-iron alloy such as Alloy No. 42 (42% nickel, 58% iron) or Alloy No. 42-6 (42% nickel, 52% iron and 6% chromium). Typical magnetic permeabilities for the magnetic layer range from fifty to about one thousand, and electrical resistivities normally range from twenty to ninety micro-ohm-centimeters as compared to 1.72 for copper; the magnetic material layer can have a Curie temperature selected to be from the range of between about 200° C. to about 500° C., for example. The thickness of the magnetic material layer is typically One to two skin depths; the skin depth is inversely proportional to the square root of the product of the magnetic permeability of the magnetic material and the frequency of the alternating current passing through the two-layer structure. Solders can be tin-lead such as for example Sn 63 reflowable at a temperature of about 183° C. or Sb-5 reflowable at a temperature of about 240° C. Generally it would be desirable to select a Curie temperature of about 15° C. to 75° C. above the solder reflow temperature.

SUMMARY OF THE INVENTION

The present invention is directed to a device for providing sufficient thermal energy to melt fusible conductive material, thereby electrically interconnecting a plurality of conductors of an electrical cable to contact pads on a surface of an electrical article. The device is useable in conjunction with a source of constant amplitude high frequency alternating current of a known frequency.

The device in accordance with the invention includes an integral member formed from a strip of a first metal and having a carrier strip section and a plurality of fingers initially integrally coextending therefrom in a common direction along a respective axis, each associated with and spaced to correspond with respective ones of contact pads of an electrical article. The integral member is formed from a strip of a first metal having a low electrical resistance and minimal magnetic permeability, the first material defining a first layer. A second metal having a high electrical resistance and high magnetic permeability defines a second layer on a major surface of the carrier strip The second layer is integral joined to the first layer and has a thickness of at least equal to one skin depth of the second metal, given the known frequency. The carrier strip section thereby defines a heater body.

Each of the fingers includes an end portion having a wire-proximate surface and an opposed pad-proximate surface that are adapted to be disposed adjacent and physically between a conductor and a corresponding contact pad on the electrical article. The fingers further include a fusible material on both the wire-proximate and pad-proximate surfaces thereof. The leading end of each finger is formed upwardly in a manner intersecting a respective axis and includes a wire-receiving slot that extends therethrough and transversely to the pad-proximate surface. The device defines a system for managing the conductors of a cable such that the conductors are aligned with the corresponding contact pads of the electrical article with the conductor and pad being separated by the corresponding finger end portion. The heater body portion of the device is then subject to a constant current of known frequency such that the heater body generates and transfers sufficient thermal energy from the heater body to the finger end portions to melt the fusible material disposed thereon, thereby electrically and mechanically interconnecting the finger end portions to the respective conductors and the contact pads on the electrical article. The heater body can then be detached from the finger end portions thereby the finger end portions remain a permanent part of the electrically conductive connection between the conductors and the contact pads.

It is object of the invention to have a device suitable for use in soldering a plurality of conductors of a cable to an array of contact pads on an electrical article.

It is a further object to have a conductor connecting device that includes means for managing the conductors such that they are in alignment for simultaneously securing corresponding conductors to corresponding contact pads.

It is also an object to eliminate the need to perform soldering in a process wherein all portions of articles are subjected to the high temperatures requisite to reflow solder.

An embodiment of the present invention will now be described in detail with reference to the accompanying drawings.

BRIEF DESCRIPTION OF THE DRAWINGS

FIG. 1 is a perspective view of the connecting device of the present invention with the conductors exploded therefrom.

FIG. 2 is a perspective view of the connection device with two conductors placed in the fingers thereof.

FIG. 3 is a perspective view of the device of FIG. 2 exploded from the corresponding contact pads of a circuit board.

FIG. 5 is an enlarged fragmentary view of a side portion of the device with a soldered connection between the conductor and contact pad on a circuit board.

DETAILED DESCRIPTION OF THE DRAWINGS

Figure 4:
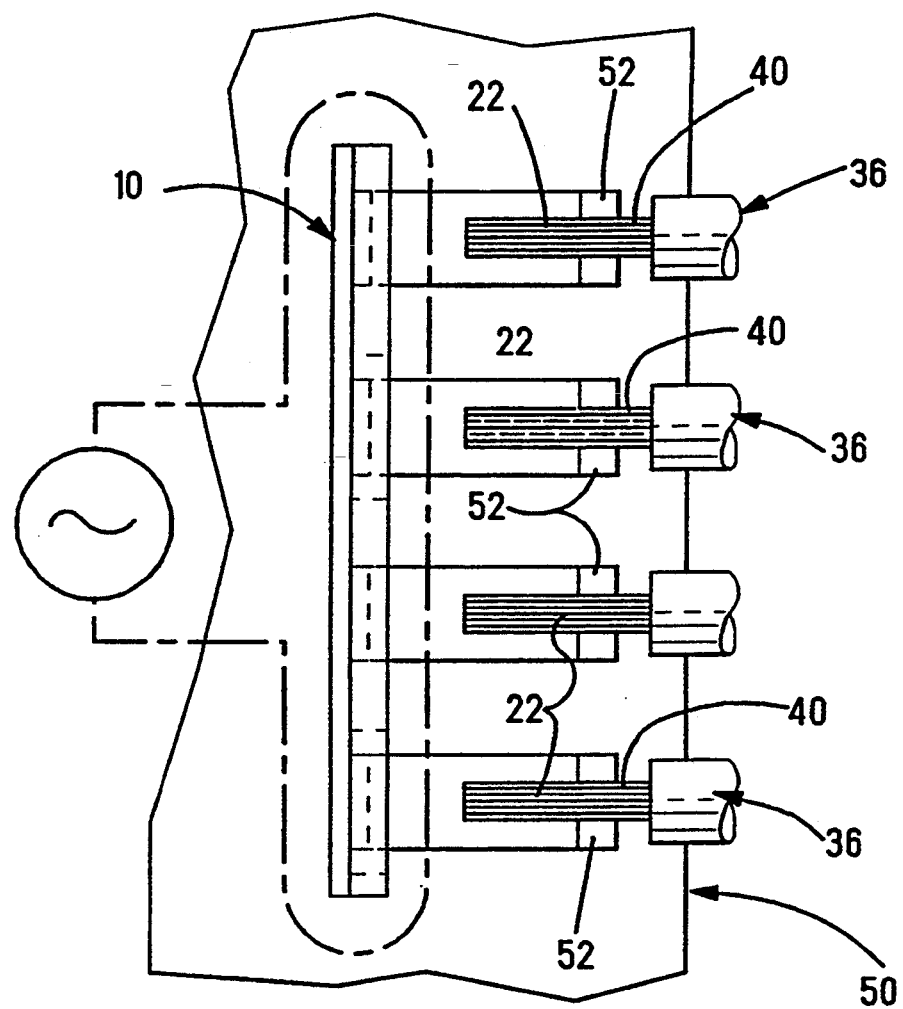
FIG. 4 is a top plan view of the assembly of FIG. 3 connected to the power source.

Referring now to FIGS. 1 through 5, the device 10 of the current invention is an integral member formed from a strip 12 of first metal having a carrier strip section 14 and a plurality of fingers 20 initially integrally coextending therefrom in a commom direction along respective axis. Carrier strip 14 also includes a plurality of pilot holes 16 used for holding and positioning the strip during the manufacturing process. The first metal has a low electrical resistance and minimal magnetic permeability such as a copper, or copper alloy, the first metal defining a first layer. A second metal layer 18 is disposed on the first layer in the carrier strip section and is integrally joined thereto, the second metal having high electrical resistance and high magnetic permeability. Preferably the second layer 18 is incrementally thin and is disposed within a skived recess of the carrier strip 14. As can be seen in FIGS. 2 and 5, the finger end portions 22 are shown to have a reduced thickness by being skived on both sides of the first material. Each finger portion 22 has opposed conductor or wire-proximate and pad-proximate surfaces 24, 26 and further includes a wire or conductor receiving slot 28. A fusible electrically conductive material 32 has been disposed in the skived sections. This material can be solder or other known conductive material. After the magnetic material and solder inlays are defined on the device, the finger end portions 22 are preferably bent around a radius to extend essentially at right angles to the carrier portion in a manner intersecting a respective axis. If desired, a layer of solder resist may be deposited the finger surfaces laterally of the solder. As alternatives to the use of inlays, the solder may be deposited by plating, printing or other methods known in the art.

Device 10 may be fabricated from strip stock of a low resistance, low magnetic permeability metal such as copper or a copper alloy, for example phosphor bronze, first layer 12 having a thickness of about 0.010 inches before skiving. Second layer 18 is of a metal which has high magnetic permeability and high resistance, the second layer for example being Alloy No. A-42 of nickel (42%) and iron (58%) and having a thickness of about 0.0005 inches or about 1 ½ to 2 times the thickness of a "skin depth" of the particular metal. Preferably the heater body of the invention is formed as a self-regulating heater as described in U.S. Pat. 5,059,756. Each finger 20 may have a reduced thickness of the first material such as about 0.006 inches after skiving. The solder 32 of the two inlays on finger end portion 22 may be Sn 63 having a reflow temperature of about 183° C., and inlays 32 each may have a thickness of about 0.002 inches. For example when device 10 is used in an array having contact pads spaced on 0.100 inch centerlines, fingers 20 may have a width of about 0.035–0.040 inches and are spaced to correspond to the spacing between the contact pads on the electrical article to be joined therewith.

In a preferred method of manufacturing the device, a continuous strip of the first metal is skived in the selected places and the second layer 18 of metal is disposed in the desired location and the solder inlays are disposed in the opposing skived recesses in the area that will become the finger portions Of the device 10. After all the layers have been applied to the strip, the strip is stamped to define the fingers 20 and wire-receiving notches 28 at the desired locations along the strip. The end portions 22 are then formed upwardly such that the wire-receiving slots extend transversely from the wire-proximate surface. The use of a layered strip provides greater flexibility in the manufacturing process, since the strip can be stamped to form devices having fingers 20 with different centerline spacings. Other methods to form the various layers may also be used, such as plating solder on the desired locations after the fingers have been stamped from the strip.

The device 10 as shown is designed to be used with a cable (not shown) having a plurality of conductors 36, portions of which are shown in FIG. 1 through 5 Each conductor 36 includes a layer of insulation and a bare end portion 40. Device 10 defines a wire management member that holds the ends of the conductors 36 at a preselected spacing for interconnection the array of contact pads 52.

FIG. 3 illustrates the method by which the connecting device 10 is mounted to the electrical article shown representively as circuit board 50. FIG. 3 also shows the alignment of the device 10 with the conductors 36 with the respective contact pads 52 on board 50 that inlaid solder portions 32 are disposed between the respective bare portions 40 of conductors 36 and contact pads 52 prior to fusing of the solder 32 thereto.

FIG. 4 illustrates one preferred method of supplying heat to the heater bodies or carrier strip 14 by connecting a source of constant amplitude alternating current across the length of the carrier strip 14 thereby inducing eddy currents in the connecting devices 10 such that the heater bodies generate and transfer sufficient thermal energy from the heater body 14 to the end connecting portions 22 to melt the fusible material 34 disposed therealong. The fusing process takes about 10-15 seconds with a maximum temperature reached being that of the Curie temperature of the selected alloy. Thus the end leg portions 22 are electrically and mechanically interconnected between the respective conductors 36 and the corresponding contact pads 52 of circuit board 50 as shown in FIG. 5

After soldering has been complete, the source of RF current is removed from carrier strip 14. The carrier strip portion 14 can then be broken off at the scored section 30 thereby leaving the end portions 22 secured between the respective conductors 36 and contact pads 52 of circuit board 50.

The present invention provides a wire management system whereby an array of cable conductors can be terminated simultaneously to an array of contact pads on a circuit board. The present invention further provides a means whereby an array of conductors can be terminated simultaneously without subjecting the device to the temperatures required for solder reflow operations or the like.

It is thought that the connecting device of the present invention and many of its attendant advantages will be understood from the foregoing description. It is apparent that various changes may be made in the form, construction, and arrangement of the parts thereof without departing from the spirit or scope of the invention or sacrificing all of its material advantages.

I claim:

1. A device for providing sufficient thermal energy to melt a fusible electrically conductive material and thereby provide electrically-conductive connections between a plurality of conductors of an electrical cable to corresponding opposed aligned contact pads on a surface of an electrical article, usable in conjunction with a source of constant amplitude high frequency alternating current of known frequency, said device comprising:

an integral member formed from strip of a first metal having low electrical resistance and minimal magnetic permeability, said integral member defining a first layer having a carrier strip section and a plurality of fingers initially integrally coextending in a common direction along respective axis therefrom, each associated with and spaced to correspond with respective ones of said contact pads of said electrical article and having pad-proximate surfaces and opposed conductor-proximate surfaces;

said carrier strip section having defined on a major surface thereof and integrally joined to said first layer thereof a second layer of a second metal having high electrical resistance and high magnetic permeability, said second layer having a thickness at least equal to one skin depth of said second metal, given said known frequency, said carrier strip section thereby defining a heater body; and said fingers being adapted to be disposed adjacent and between a corresponding contact pad of said electrical article and a respective conductor of said cable, each said finger including an end portion extending transversely in a manner intersecting a respective said axis, said end portion including a conductor-receiving aperture extending therethrough parallel to said respective axis, said finger having fusible electrically conductive material on said conductor-proximate and pad-proximate surfaces thereof, whereby upon disposing said conductors on said conductor-proximate surfaces of respective ones of said fingers and placing said fingers adjacent respective ones of said contact pads of said electrical article such that each said finger is disposed adjacent and physically between a corresponding conductor of said cable and a respective contact pad of said electrical article, such that upon said heater body being subjected to said constant current of known frequency, said heater body generates and transfers said sufficient thermal energy from said heater body to said finger to melt said fusible material disposed therealong thereby electrically and mechanically interconnecting said fingers to associated ones of both said corresponding and respective conductors and contact pads, whereafter said heater body is detachable from said fingers along said electrical article thereby electrically isolating the interconnections in which the fingers remain a permanent part of an electrically-conductive connection between the conductors of said cable and the contact pads of said electrical article.

2. The device of claim 1 wherein each said wire-receiving slot has a width preselected to receive thereinto an insulated portion of a said conductor proximate a bare end portion thereof.

3. The device of claim 1 wherein each said finger includes recesses into said conductor-proximate and pad-proximate surfaces within which are disposed inlays of said fusible material.

4. The device of claim 1 wherein portions of surfaces of each said finger laterally of said fusible material are coated with solder resist material.

5. The device of claim 1 wherein frangible sections are formed along each said finger proximate said carrier strip facilitating manual removal of said carrier trip following said fusing.

6. The device of claim 1 wherein said carrier strip is at a substantial angle from said fingers enabling placement along said surface of an article remote from an edge thereof.

7. The device of claim 1 wherein said conductor-receiving aperture is a slot extending to an end edge of said end portion.

* * * * *